United States Patent
Lee et al.

(10) Patent No.: US 10,978,571 B2
(45) Date of Patent: Apr. 13, 2021

(54) SELF-ALIGNED CONTACT WITH METAL-INSULATOR TRANSITION MATERIALS

(71) Applicant: International Business Machines Corporation, Armonk, NY (US)

(72) Inventors: Choonghyun Lee, Rensselaer, NY (US); Kangguo Cheng, Schenectady, NY (US); Juntao Li, Cohoes, NY (US); Peng Xu, Santa Clara, CA (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/168,969

(22) Filed: Oct. 24, 2018

(65) Prior Publication Data
US 2020/0135881 A1 Apr. 30, 2020

(51) Int. Cl.
| | |
|---|---|
| *H01L 21/285* | (2006.01) |
| *H01L 21/768* | (2006.01) |
| *H01L 21/02* | (2006.01) |
| *H01L 21/324* | (2006.01) |
| *H01L 29/66* | (2006.01) |
| *H01L 29/06* | (2006.01) |
| *H01L 29/45* | (2006.01) |

(52) U.S. Cl.
CPC ...... *H01L 29/665* (2013.01); *H01L 21/28518* (2013.01); *H01L 21/28556* (2013.01); *H01L 21/76897* (2013.01); *H01L 29/45* (2013.01); *H01L 29/66636* (2013.01)

(58) Field of Classification Search
CPC .................. H01L 29/45; H01L 21/28556
See application file for complete search history.

(56) References Cited

U.S. PATENT DOCUMENTS

| | | |
|---|---|---|
| 7,449,782 B2 | 11/2008 | Cabral, Jr. et al. |
| 8,232,613 B2 | 7/2012 | Moon et al. |
| 8,436,404 B2 | 5/2013 | Bohr et al. |

(Continued)

OTHER PUBLICATIONS

Choonghyun Lee et al."Self-Aligned Contact With Metal-Insulator Transistion Materials", U.S. Appl. No. 16/686,344, filed Nov. 18, 2019.

(Continued)

*Primary Examiner* — Omar F Mojaddedi
(74) *Attorney, Agent, or Firm* — Cantor Colburn LLP; Randall Bluestone (57) ABSTRACT

Embodiments of the present invention are directed to techniques for forming a self-aligned contact liner using metal-insulator transition materials. The self-aligned contact architecture described herein prevents a short between the gate and the source/drain, even when the self-aligned contact (SAC) cap has eroded to the point where the gate is exposed. In a non-limiting embodiment of the invention, a dielectric cap is formed over a conductive gate. A source or drain region is formed adjacent to the conductive gate. A dielectric liner is formed over the dielectric cap and the source or drain region such that a first portion of the dielectric liner is on a surface of the source or drain region. The dielectric liner includes a metal-insulator transition material. The first portion of the dielectric liner is metalized via germanium oxide sublimation.

15 Claims, 6 Drawing Sheets

(56) References Cited

U.S. PATENT DOCUMENTS

| | | | |
|---|---|---|---|
| 9,129,897 B2 | 9/2015 | Pore et al. | |
| 9,472,628 B2 | 10/2016 | Cheng et al. | |
| 9,722,026 B2 | 8/2017 | Toriumi et al. | |
| 9,754,942 B2 | 9/2017 | Bergendahl et al. | |
| 10,347,762 B1* | 7/2019 | Liu | H01L 29/7848 |
| 2007/0047899 A1* | 3/2007 | Khang | H01L 29/42332 |
| | | | 385/147 |
| 2012/0270393 A1* | 10/2012 | Pore | H01L 29/665 |
| | | | 438/658 |
| 2014/0084340 A1* | 3/2014 | Wang | H01L 21/76888 |
| | | | 257/190 |
| 2014/0183434 A1* | 7/2014 | Lim | H01L 27/2463 |
| | | | 257/4 |
| 2015/0021683 A1 | 1/2015 | Xie et al. | |
| 2017/0054004 A1* | 2/2017 | Cheng | H01L 29/66553 |
| 2017/0256582 A1* | 9/2017 | Futatsugi | H01L 27/14689 |
| 2019/0035693 A1* | 1/2019 | Li | H01L 21/823821 |

OTHER PUBLICATIONS

List of IBM Patents or Patent Applications Treated as Related; (Appendix P), Date Filed Nov. 18, 2019; 2 pages.

C. H. Lee et al., "Oxygen Potential Engineering of Interfacial Layer for Deep Sub-nm EOT High-k Gate Stacks on Ge", International Electron Devices Meeting, IEDM, 2013, 2.5, 4 pages.

Su Chen Fan, "Gas Cluster Ion Beam Processing for Improved Self Aligned Contact Yield at 7 nm Node FinFET", MJ: MOL and Junction Interfaces, 29th Annual Semi Advanced Semiconductor Manufacturing Conference (ASMC), 2018, pp. 208-210.

* cited by examiner

SELF-ALIGNED CONTACT WITH METAL-INSULATOR TRANSITION MATERIALS

BACKGROUND

The present invention generally relates to fabrication methods and resulting structures for semiconductor devices, and more specifically, to fabrication methods and resulting structures for a self-aligned contact liner formed using metal-insulator transition materials.

Traditional metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. Some nonplanar transistor architectures, such as fin-type field effect transistors (finFETs) and nanosheet field effect transistors (NSFETs), employ semiconductor channels with various replacement metal gate (RMG) and gate-all-around (GAA) technologies to achieve increased device density, greater power efficiency, and some increased performance over lateral devices. In a finFET, for example, a gate runs along the sidewalls and top surface of each semiconductor fin, enabling fuller depletion in the channel region, and reducing short-channel effects due to steeper subthreshold swing (SS) and smaller drain induced barrier lowering (DIBL). FinFET fabrication includes the formation of source/drain metal contacts in a tight contact poly pitch (CPP) or contact gate pitch (CGP) after gate structure. Due to the dimensional limits of nonplanar device structures, an electrical short between the gate and the source/drain metal contact often occurs.

SUMMARY

Embodiments of the invention are directed to a method for forming a self-aligned contact liner using metal-insulator transition materials. A non-limiting example of the method includes forming a dielectric cap over a conductive gate. A source or drain (S/D) region is formed adjacent to the conductive gate. A dielectric liner is formed over the dielectric cap and the (S/D) region such that a first portion of the dielectric liner is on a surface of the (S/D) region. The dielectric liner includes a metal-insulator transition material. The first portion of the dielectric liner is metalized via germanium oxide sublimation.

Embodiments of the invention are directed to a method for forming a self-aligned contact liner using metal-insulator transition materials. A non-limiting example of the method includes conformally forming a metal-insulator transition material on a surface of a conductive gate and on a surface of a (S/D) region. A portion of the metal-insulator transition material in contact with the surface of the (S/D) region is selectively metalized via germanium oxide sublimation.

Embodiments of the invention are directed to a semiconductor structure. A non-limiting example of the semiconductor device includes a dielectric cap over a conductive gate. The device further includes a (S/D) region adjacent to the conductive gate. A conformal liner is adjacent to a sidewall of the dielectric cap and on the (S/D) region. A first portion of the conformal liner is on a surface of the conductive gate. The first portion includes a metal-doped germanium oxide. A second portion of the conformal liner is on the (S/D) region. The second portion includes a silicide or a germanide.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, the ability to decrease the gate pitch for nonplanar transistors is limited by the required gate length and gate spacer thickness. There are challenges, however, when scaling some nonplanar transistor architectures beyond the 10 nm node. One such challenge is that smaller device dimensions make the transistor structure more susceptible to unintended damage during fabrication operations. For example, erosion of the self-aligned contact (SAC) cap on the gate can occur during the source/drain contact formation process. During this process the source/drain regions are opened to allow for the placing of source/drain contacts. Unfortunately, as device scaling pushes the SAC cap and spacer to smaller thicknesses, the same process that is required to open the source/drain regions can result in sufficient erosion of the SAC cap to expose a portion of the gate. Exposing any portion of the gate results in a short between the gate and the source/drain after the source/drain contact is formed.

Turning now to an overview of aspects of the present invention, one or more embodiments of the invention address the above-described shortcomings of the prior art by providing fabrication methods and resulting structures for a self-aligned contact formed using metal-insulator transition materials. The self-aligned contact architecture described herein prevents a short between the gate and the source/drain, even when the SAC cap has eroded to the point where the gate is exposed. After opening the source/drain regions, a liner made from metal-insulator transition materials, such as, for example, metal-doped germanium oxide (M-GeO$_x$), is conformally formed over the damaged SAC cap and the source/drain. The metal-insulator transition materials are normally dielectric materials and serve to insulate the exposed gate from the source/drain contacts. Advantageously, a low-temperature thermal anneal can be used to selectively metalize the portion of the metal-insulator liner in contact with the source/drain, leaving behind a conductive layer (e.g., a silicide, a germanide, or a mixture of silicide and germanide) that allows the source/drain to be electrically coupled to source/drain contacts. The metal-insulator transition materials are metalized during a self-aligned process during which GeO sublimation occurs on a surface of the source/drain according to the formula:

2M-GeO$_x$+Si+Ge→2GeO(volatile)+M-Si(silicide)+
M-Ge(germanide)    (I)

Figure 1:
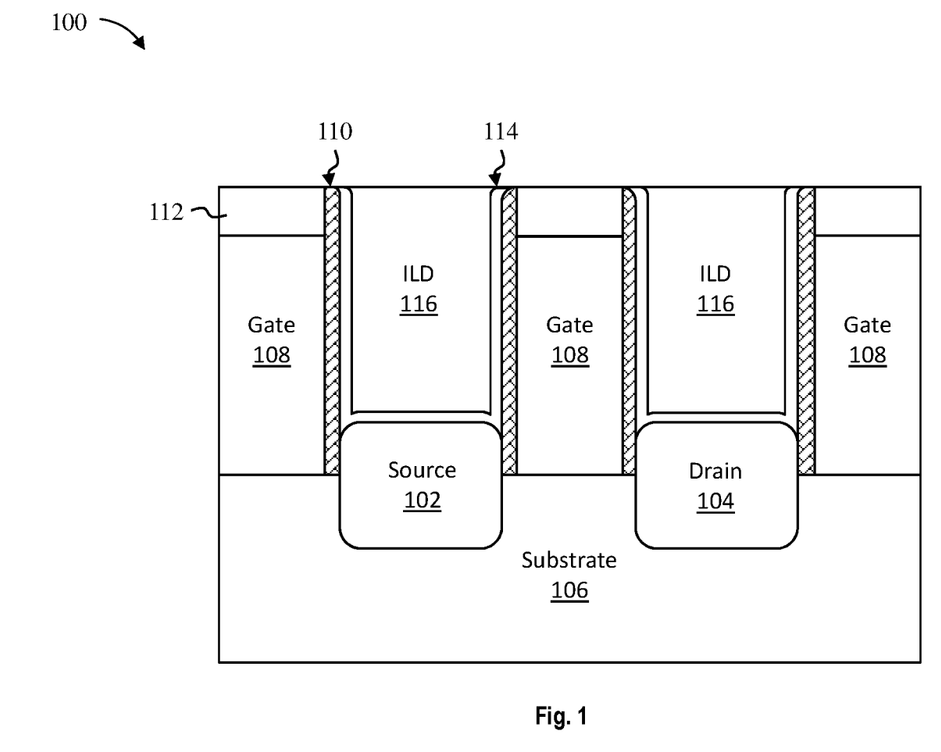
FIG. 1 depicts a cross-sectional view of a semiconductor structure after a processing operation according to one or more embodiments of the invention.

Turning now to a more detailed description of aspects of the present invention, FIG. 1 depicts a cross-sectional view of a semiconductor structure 100 during an intermediate operation of a method of fabricating a final semiconductor device according to one or more embodiments of the invention. In embodiments of the invention, the final semiconductor device can be a variety of types of MO SFETs, including, for example, planar and non-planar n-type field effect transistors (NFET) and p-type field effect transistors (PFET). In the embodiment shown in FIG. 1, the semiconductor device formed by the semiconductor structure 100 includes nonplanar transistors coupled in series and having shared source regions 102 and shared drain regions 104 formed over a substrate 106. While depicted as having a single source and drain for ease of illustration, it is understood that the substrate 106 can include any number of source-drain pairs.

In some embodiments, the source 102 and the drain 104 can be epitaxially grown on an exposed surface of the substrate 106. The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on other exposed surfaces, such as silicon dioxide or silicon nitride surfaces.

Epitaxial semiconductor materials can be grown using, for example, vapor-phase epitaxy (VPE), molecular beam epitaxy (MBE), liquid-phase epitaxy (LPE), or other suitable processes. The source 102 and the drain 104 can be epitaxial semiconductor materials grown from gaseous or liquid precursors.

In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxial silicon and silicon germanium can be doped by adding n-type dopants (e.g., phosphorus or arsenic) or p-type dopants (e.g., Ga, B, BF$_2$, or Al). In some embodiments, the source 102 and the drain 104 can be epitaxially formed and doped by a variety of methods, such as, for example, in-situ doped epitaxy (doped during deposition), doped following the epitaxy, or by implantation and plasma doping. The dopant concentration in the doped regions can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$.

In some embodiments, the source 102 and the drain 104 are made of silicon germanium. In some embodiments, the source 102 and the drain 104 are made of silicon germanium having a germanium concentration of about 10 to about 65 percent, for example, 50 percent, although other germanium concentrations are within the contemplated scope of the invention. In some embodiments, the source 102 and the drain 104 are SiGe:B (boron doped silicon germanium) regions, although other dopants are within the contemplated scope of the invention.

In some embodiments, a surface of the substrate 106 can be recessed prior to forming the source 102 and the drain 104. In some embodiments, the substrate 106 is recessed and the source 102 and the drain 104 are epitaxially grown above a topmost surface of the substrate 106. In this manner, the source 102 and the drain 104 can extend above and below the topmost surface of the substrate 106.

The substrate 106 can be made of any suitable substrate material, such as, for example, monocrystalline Si, silicon germanium (SiGe), III-V compound semiconductor, II-VI compound semiconductor, or semiconductor-on-insulator (SOI). In some embodiments, the substrate 106 can be a silicon substrate. In some embodiments, the substrate 106 includes a buried oxide layer (not depicted). The buried oxide layer can be made of any suitable dielectric material, such as, for example, a silicon oxide. In some embodiments, the buried oxide layer is formed to a thickness of about 145 nm, although other thicknesses are within the contemplated scope of the invention. The semiconductor structure 100 can be electrically isolated from other regions of the substrate 106 by a shallow trench isolation region (not depicted).

As illustrated in FIG. 1, one or more conductive gates 108 (sometimes referred to as metal gates) can be formed over the substrate 106 during, for example, a replacement metal gate (RMG) process. In some embodiments, a conductive gate is formed between each source-drain pair. For example, a conductive gate 108 can be formed between the source 102 and the drain 104.

Prior to the RMG process, a sacrificial gate (sometimes referred to as a dummy gate, not depicted), is formed over the substrate 106. The sacrificial gates are replaced by the conductive gates 108 during the RMG process. The sacrificial gate can be made of any suitable material, such as, for example, amorphous silicon or polysilicon. The sacrificial gate can be formed using any known method for patterning a sacrificial gate, such as, for example, a polysilicon fill and a wet etch, a dry etch, or a combination of sequential wet and/or dry etches.

In some embodiments, spacers 110 (also known as sidewall spacers or gate spacers) are formed on sidewalls of the sacrificial gate. In some embodiments, the spacers 110 are formed using a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, or other like processes in combination with a wet or dry etch process. For example, spacer material can be conformally deposited over the semiconductor structure 100 and selectively removed using a RIE to form the spacers 110. The spacers 110 can be made of any suitable material, such as, for example, a low-k dielectric, a nitride, silicon nitride, silicon oxide, SiON, SiC, SiOCN, or SiBCN. The spacers 110 can be formed to a thickness of about 5 to 10 nm, although other thicknesses are within the contemplated scope of the invention.

The conductive gates 108 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive material can further include dopants that are incorporated during or after deposition.

In some embodiments, the conductive gates 108 are high-k metal gates (HKMG) and a high-k dielectric film (not depicted) is formed between each conductive gate and the substrate 106. In some embodiments, the high-k dielectric film can be used to modify the work function of the conductive gates 108. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the high-k dielectric film can have a thickness of about 0.5 nm to about 4 nm. In some embodiments, the high-k dielectric film has a thickness of about 2 nm, although other thicknesses are within the contemplated scope of the invention.

In some embodiments, work function layers (not depicted) are formed between the high-k dielectric film and the conductive gates 108. The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to further modify the work function of the conductive gates 108. The work function layers can be formed to a thickness of about 2 to 10 nm, although other thicknesses are within the contemplated scope of the invention.

In some embodiments, a dielectric cap 112 (sometimes referred to as a self-aligned contact cap) is formed between an adjacent pair of the spacers 110 on a surface of a gate of the conductive gates 108. The dielectric cap 112 can be made of any suitable material, such as, for example, a low-k dielectric, a nitride, silicon nitride, silicon oxide, SiON, SiC, SiOCN, or SiBCN. In some embodiments, the dielectric cap includes silicon nitride. The dielectric cap 112 can be formed using CVD, PECVD, ALD, PVD, chemical solution deposition, or other like processes. The dielectric cap 112 can be formed to a thickness of about 5 to 100 nm, for example, 10 nm, although other thicknesses are within the contemplated scope of the invention.

As illustrated in FIG. 1, a dielectric liner 114 can be formed over sidewalls of the spacers 110 and a surface of the source 102 or the drain 104. In some embodiments, the dielectric liner 114 is formed using a CVD, PECVD, UHVCVD, RTCVD, MOCVD, LPCVD, LRPCVD, ALD, PVD, chemical solution deposition, or other like processes in combination with a wet or dry etch process. For example, dielectric material can be conformally deposited over the semiconductor structure 100 and selectively removed using a RIE to form the dielectric liner 114. The dielectric liner 114 can be made of any suitable material, such as, for example, a low-k dielectric, a nitride, silicon nitride, silicon oxide, SiON, SiC, SiOCN, or SiBCN. The dielectric liner 114 can be formed to a thickness of about 0.2 to 10 nm, for example 2 nm, although other thicknesses are within the contemplated scope of the invention.

In some embodiments, an interlayer dielectric 116 is formed over the source 102 and the drain 104. In some embodiments, the interlayer dielectric 116 is formed such that the dielectric liner 114 is between the interlayer dielectric 116 and the source 102 and/or the drain 104. The interlayer dielectric 116 can be made of any suitable dielectric material, such as, for example, porous silicates, carbon doped oxides, silicon dioxides, silicon nitrides, silicon oxynitrides, or other dielectric materials. In some embodiments, the interlayer dielectric 116 includes a silicon oxide, such as $SiO_2$. Any known manner of forming the interlayer dielectric 116 can be utilized, such as, for example, CVD, PECVD, ALD, flowable CVD, spin-on dielectrics, or PVD. In some embodiments, the interlayer dielectric 116 is planarized to a top surface of the spacers 110 and/or the dielectric cap 112, using, for example, a chemical-mechanical planarization (CMP) process.

Figure 2:
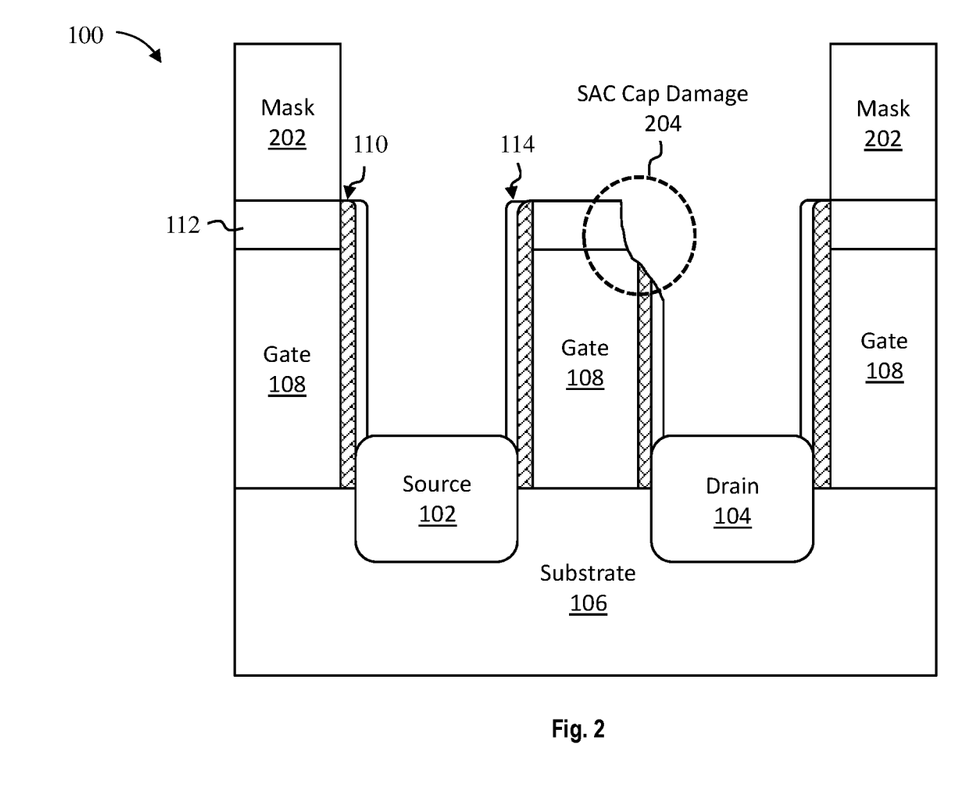
FIG. 2 depicts a cross-sectional view of a semiconductor structure after a processing operation according to one or more embodiments of the invention.

FIG. 2 depicts a cross-sectional view of the semiconductor structure 100 during an intermediate operation of a method of fabricating a semiconductor device according to one or more embodiments of the invention. As illustrated in FIG. 2, a hard mask 202 can be formed over the semiconductor structure 100. In some embodiments, portions of the hard mask 202 are removed (e.g., patterned) to expose a surface of the interlayer dielectric 116.

In some embodiments, the interlayer dielectric 116 and a portion of the dielectric liner 114 can be removed to expose a surface of the source 102 and a surface of the drain 104. The interlayer dielectric 116 and the portion of the dielectric liner 114 covering the source 102 and the drain 104 can be removed using, for example, a wet etch, a dry etch, or a combination of sequential wet and/or dry etches. In some embodiments, the interlayer dielectric 116 and the portion of the dielectric liner 114 covering the source 102 and the drain 104 are removed using a directional reactive ion etch (RIE).

In some embodiments, the interlayer dielectric 116 and the portion of the dielectric liner 114 covering the source 102 and the drain 104 are removed using a RIE that is not completely selective to the dielectric cap 112 and the spacers 110. In other words, portions of the dielectric cap 112 can be inadvertently removed during the RIE, resulting in SAC cap damage 204. In some embodiments, the dielectric cap 112 is sufficiently damaged (eroded) to expose a portion of the conductive gate 108, as depicted in FIG. 2. As discussed previously herein, exposing the conductive gate 108 results in a short between the conductive gate 108 and the source/drain contacts which are formed over the source 102 and the drain 104 in a downstream process (see, e.g., FIG. 5).

Figure 3:
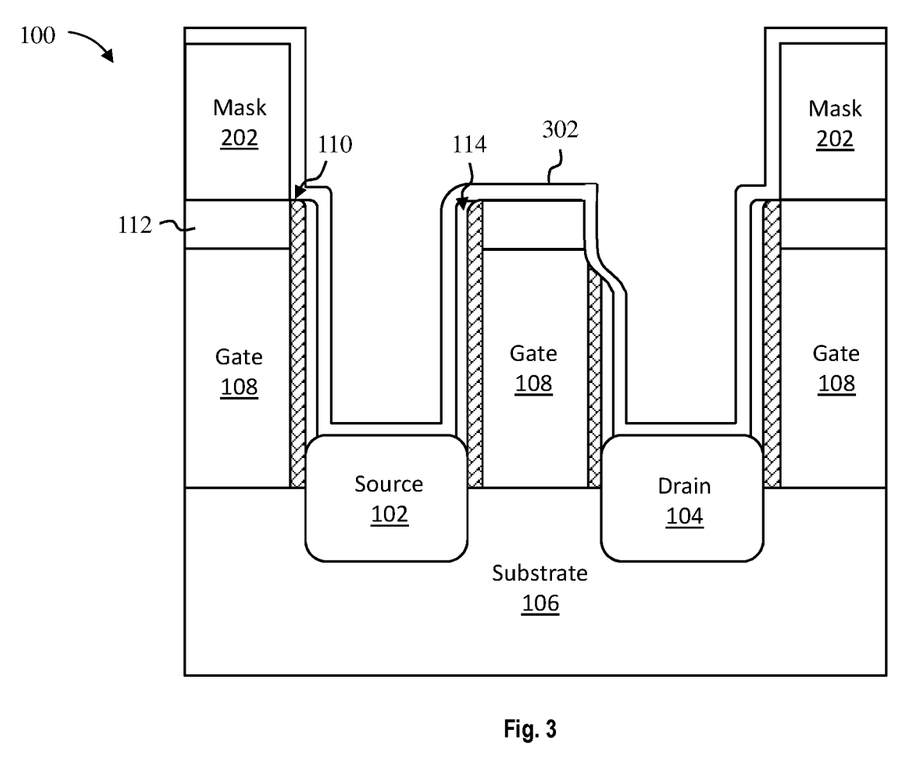
FIG. 3 depicts a cross-sectional view of a semiconductor structure after a processing operation according to one or more embodiments of the invention.

FIG. 3 depicts a cross-sectional view of the semiconductor structure 100 during an intermediate operation of a method of fabricating a semiconductor device according to one or more embodiments of the invention. As illustrated in FIG. 3, a metal-insulator transition material 302 can be deposited over the semiconductor structure 100. The metal-insulator transition material 302 can be formed using a CVD, PECVD, UHVCVD, RTCVD, MOCVD, LPCVD, LRPCVD, ALD, PVD, chemical solution deposition, or other like processes. In some embodiments, the metal-insulator transition material 302 is conformally deposited to a thickness of about 0.2 to 10 nm, for example 2 nm, although other thicknesses are within the contemplated scope of the invention.

In some embodiments, the metal-insulator transition material 302 includes a metal-doped germanium oxide (M-GeO$_x$). The metal species can include, for example, yttrium (Y), scandium (Sc), hafnium (Hf), titanium (Ti), aluminum (Al), and lanthanum (La), although other metals are within the contemplated scope of the invention. In some embodiments, the metal species is doped to a concentration of about 5 to about 30 percent (e.g., 5-30 percent metal in GeO$_x$). Metal-doped germanium oxide is a dielectric material having a dielectric constant of about 7 to about 10, depending on the particular metal species and the metal concentration in the bulk GeO$_2$. For example, the dielectric constant for yttrium-doped germanium oxide (Y—GeO$_x$) varies from about 6 at an yttrium concentration of about 0 to about 9 at an yttrium concentration of about 30 percent.

Figure 4:
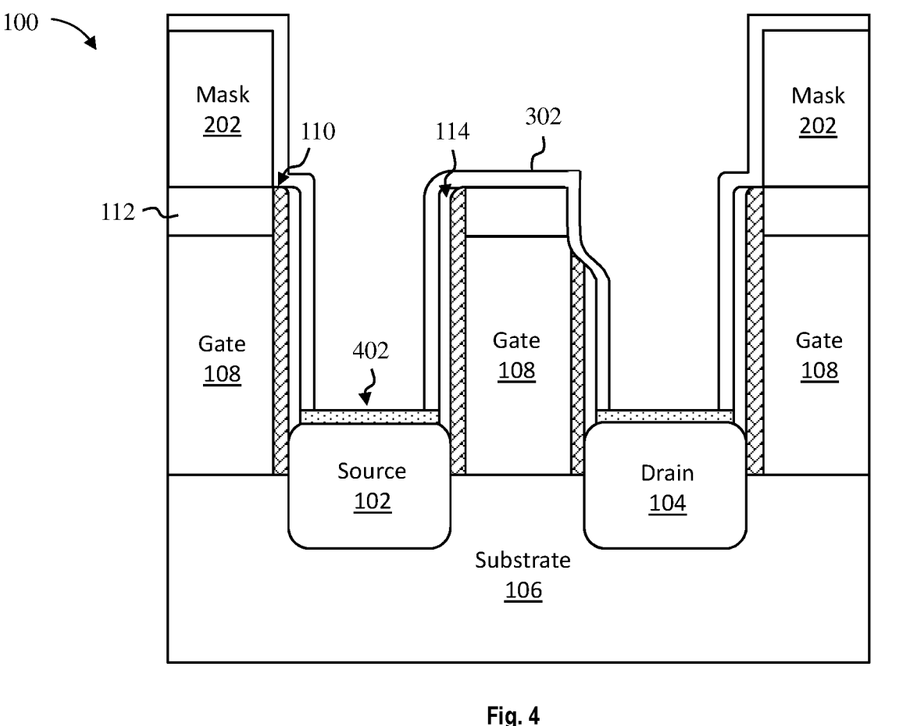
FIG. 4 depicts a cross-sectional view of a semiconductor structure after a processing operation according to one or more embodiments of the invention.

FIG. 4 depicts a cross-sectional view of the semiconductor structure 100 during an intermediate operation of a method of fabricating a semiconductor device according to one or more embodiments of the invention. As illustrated in FIG. 4, a portion of the metal-insulator transition material 302 can be metalized to form a conductive layer 402 over a surface of the source 102 and/or the drain 104.

As discussed previously herein, a thermal anneal can be used to selectively metalize the portion of the metal-insulator transition material 302 in contact with the source 102 and/or the drain 104, leaving behind the conductive layer 402. In some embodiments, the thermal anneal is a low temperature anneal that can be carried out at a temperature of about 500 degrees Celsius or below using a nitrogen ambient. During the anneal, silicon and germanium in the source 102 and the drain 104 act as a catalyst, resulting in GeO sublimation at the interface of the metal-insulator transition material 302 and the source 102/drain 104 according to the formula:

$$2\text{M-GeO}_x + \text{Si} + \text{Ge} \rightarrow 2\text{GeO(volatile)} + \text{M-Si(silicide)} + \text{M-Ge(germanide)} \quad (I)$$

The conductive layer 402 which remains after the GeO sublimation includes a silicide, a germanide, or a mixture of silicide and germanide. Silicide and germanide are conductive, and allow the source 102 and the drain 104 to be electrically coupled to source/drain contacts. Advantageously, the metal-insulator transition material 302 is selectively metalized only where the metal-insulator transition material 302 is in contact with the source 102 and/or the drain 104 (i.e., where the silicon and germanium in the source 102 and the drain 104 act as a catalyst), resulting in a self-aligned process.

GeO is a volatile species, and any formed during the low temperature anneal can be removed using known processes, such as, for example, off-gassing, venting, or bake-out. Unreacted portions of the metal-insulator transition material 302 (i.e., those portions that were not in contact with the source 102 and/or the drain 104) remain unmetallized, providing a dielectric buffer over the conductive gate 108.

The selective metallization of the metal-insulator transition material 302 is self-limited and will continue until all of the metal-insulator transition material 302 at the source/ drain interface is consumed. In this manner, the final thickness of the conductive layer 402 depends on the deposited thickness of the metal-insulator transition material 302. For example, if the metal-insulator transition material 302 is deposited to a thickness of about 3 nm, the final thickness of the conductive layer 402 will be about 3 nm.

Figure 5:
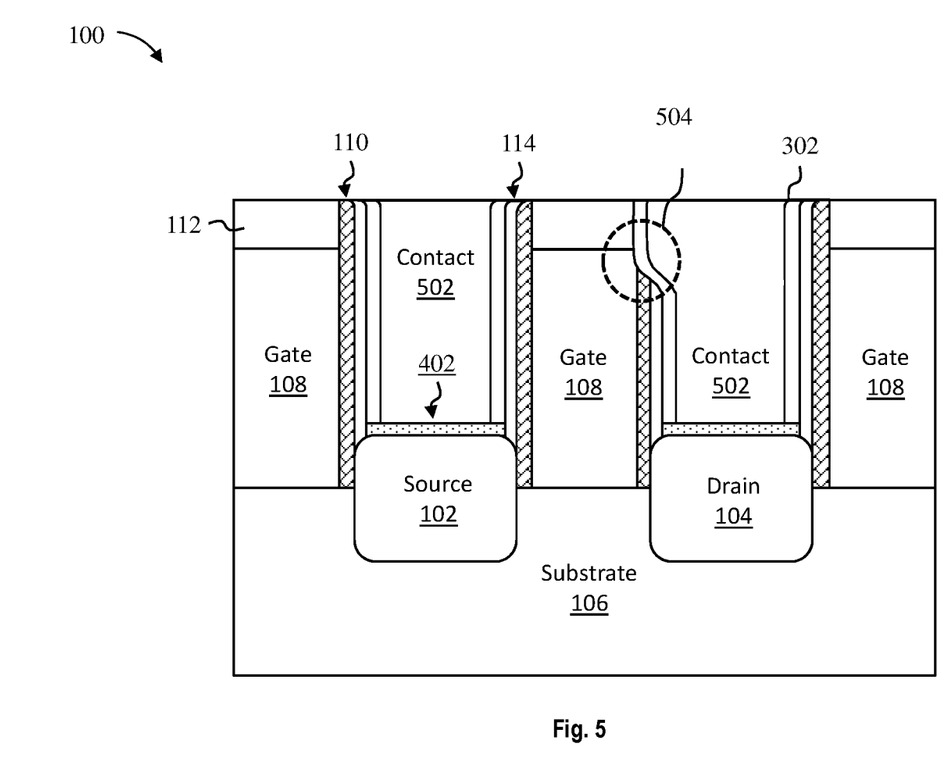
FIG. 5 depicts a cross-sectional view of a semiconductor structure after a processing operation according to one or more embodiments of the invention.

FIG. 5 depicts a cross-sectional view of the semiconductor structure 100 during an intermediate operation of a method of fabricating a semiconductor device according to one or more embodiments of the invention. As illustrated in FIG. 5, source and drain contacts 502 can be formed between sidewalls of the metal-insulator transition material 302 and on a surface of the conductive layer 402. The contacts 502 provide electrical contact to the source 102 and the drain 104.

The contacts 502 can be of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments, the contacts 502 are tungsten contacts. The conductive material can further include dopants that are incorporated during or after deposition. In some embodiments, the contacts can be copper and can include a barrier metal liner. The barrier metal liner prevents the copper from diffusing into, or doping, the surrounding materials, which can degrade their properties. Examples include tantalum nitride and tantalum (TaN/Ta), titanium, titanium nitride, cobalt, ruthenium, and manganese.

The contacts 502 can be formed using known metallization techniques. In some embodiments, a bulk conductive material (e.g., a metal) is deposited over the source 102 and the drain 104. In some embodiments, the bulk conductive material is overfilled over the source 102 and the drain 104, forming overburdens above a surface of the dielectric cap 112. In some embodiments, a CMP removes the overburden. In some embodiments, the CMP is selective to the dielectric cap 112 and/or the spacers 110. In some embodiments, the hard mask 202 is removed prior to the CMP. In some embodiments, the hard mask 202 is removed during the CMP.

As depicted in FIG. 5, a portion 504 of the metal-insulator transition material 302 electrically isolates the exposed portion of the conductive gates 108 from the contacts 502. In this manner, the metal-insulator transition material 302 provides a dielectric buffer that prevents a short between the conductive gates 108 and the contacts 502, even when the dielectric cap 112 has eroded to the point where a conductive gate is exposed.

Figure 6:
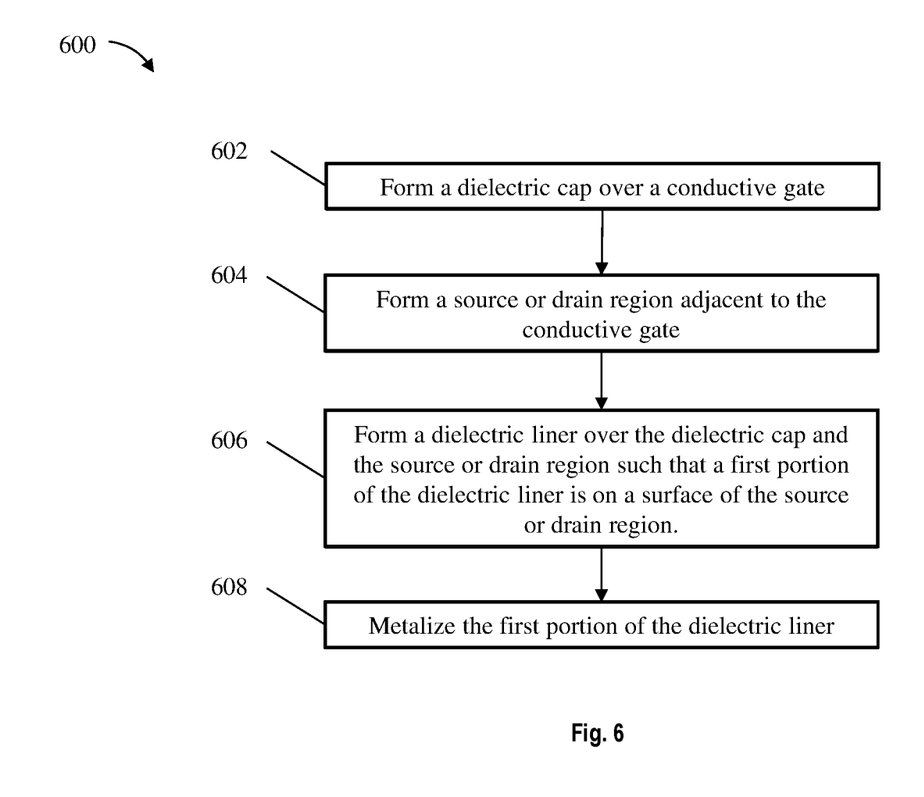
FIG. 6 depicts a flow diagram illustrating a method according to one or more embodiments of the invention.

FIG. 6 depicts a flow diagram 600 illustrating a method for forming a semiconductor device according to one or more embodiments of the invention. As shown at block 602, a dielectric cap is formed over a conductive gate. At 604, a source or drain region is formed adjacent to the conductive gate.

As shown at block 606, a dielectric liner is formed over the dielectric cap and the source or drain region such that a first portion of the dielectric liner is on a surface of the source or drain region. The dielectric liner includes a metal-insulator transition material, such as, for example, a metal-doped germanium oxide.

At block 608, the first portion of the dielectric liner (i.e., that portion in contact with a surface of the source or drain region) is metalized. Metallization can occur as previously described herein, for example, via germanium oxide sublimation. Advantageously, metallization is confined to the surface of the source or drain region, leaving a dielectric liner over any exposed portions of the conductive gate.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming a dielectric cap over a conductive gate, wherein sidewalls of the dielectric cap and sidewalls of the conductive gate are confined between and in direct contact with sidewalls of a gate spacer;
   exposing a surface of a source or drain (S/D) region adjacent to the conductive gate, wherein exposing the S/D region results in damage that exposes a surface of the conductive gate;
   forming a dielectric liner over the dielectric cap and the (S/D) region such that a first portion of the dielectric liner is on a surface of the (S/D) region and a second portion of the dielectric liner is directly on the exposed surface of the conductive gate, the dielectric liner comprising a metal-insulator transition material; and
   metalizing the first portion of the dielectric liner.

2. The method of claim 1, wherein metalizing the first portion of the dielectric liner comprises annealing the semiconductor device at a temperature of about 500 degrees Celsius.

3. The method of claim 1, wherein the metal-insulator transition material comprises metal-doped germanium oxide (M-GeO$_x$).

4. The method of claim 3, wherein the metal-doped germanium oxide is metalized on the surface of the source or drain region according to the formula:

$$2\text{M-GeO}_x + \text{Si} + \text{Ge} \rightarrow 2\text{GeO(volatile)} + \text{M-Si(silicide)} + \text{M-Ge(germanide)}. \quad \text{(I)}$$

5. The method of claim 3, wherein the metal-doped germanium oxide comprises a metal dopant having a concentration of about 5 to about 30 percent.

6. The method of claim 5, wherein the metal dopant comprises yttrium (Y), scandium (Sc), hafnium (Hf), titanium (Ti), aluminum (Al), or lanthanum (La).

7. The method of claim 1, wherein the dielectric cap comprises a self-aligned contact cap.

8. The method of claim 1, wherein the source or drain region comprises silicon germanium having a germanium concentration of about 10 percent to about 65 percent.

9. A method for forming a semiconductor device, the method comprising:
   exposing a surface of a source or drain (S/D) region adjacent to a conductive gate, wherein exposing the S/D region results in damage that exposes a surface of a conductive gate;
   conformally forming a metal-insulator transition material directly on the exposed surface of the conductive gate and on a surface of the S/D region; and
   selectively metalizing a portion of the metal-insulator transition material in contact with the surface of the (S/D) region.

10. The method of claim 9, wherein selectively metalizing the portion of the metal-insulator transition material further comprises a germanium oxide sublimation.

11. The method of claim 10, wherein germanium oxide sublimation occurs on the surface of the source or drain region according to the formula:

$$2\text{M-GeO}_x + \text{Si} + \text{Ge} \rightarrow 2\text{GeO(volatile)} + \text{M-Si(silicide)} + \text{M-Ge(germanide)}. \quad \text{(I)}$$

12. The method of claim 9, wherein the metal-insulator transition material comprises metal-doped germanium oxide (M-GeO$_x$).

13. The method of claim 12, wherein the metal-doped germanium oxide comprises a metal dopant having a concentration of about 5 to about 30 percent.

14. The method of claim 13, wherein the metal dopant comprises yttrium (Y), scandium (Sc), hafnium (Hf), titanium (Ti), aluminum (Al), or lanthanum (La).

15. The method of claim 9, wherein the (S/D) region comprises silicon germanium having a germanium concentration of about 10 percent to about 65 percent.

* * * * *